(12) United States Patent
Doan

(10) Patent No.: US 6,391,778 B1
(45) Date of Patent: May 21, 2002

(54) CONTACT/VIA FORCE FILL TECHNIQUES AND RESULTING STRUCTURES

(75) Inventor: Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/505,607

(22) Filed: Feb. 17, 2000

Related U.S. Application Data

(62) Division of application No. 09/146,719, filed on Sep. 3, 1998, now Pat. No. 6,124,205.

(51) Int. Cl.[7] ............................................... H01L 21/44
(52) U.S. Cl. ........................ 438/688; 438/542; 438/699
(58) Field of Search ............................. 438/688, 699, 438/542, 544

(56) References Cited

U.S. PATENT DOCUMENTS

| | | | |
|---|---|---|---|
| 4,941,032 A | | 7/1990 | Kobayashi et al. |
| 4,994,162 A | | 2/1991 | Armstrong et al. .... 204/192.15 |
| 5,355,020 A | | 10/1994 | Lee et al. |
| 5,512,512 A | | 4/1996 | Isobe |
| 5,527,561 A | | 6/1996 | Dobson |
| 5,534,463 A | * | 7/1996 | Lee et al. .................... 438/688 |
| 5,545,487 A | * | 8/1996 | Ishijima et al. ............. 438/548 |
| 5,789,317 A | * | 8/1998 | Batra et al. .................. 438/642 |
| 5,868,878 A | * | 2/1999 | Matossian et al. .......... 148/565 |
| 5,985,763 A | | 11/1999 | Hong et al. |
| 5,998,296 A | | 12/1999 | Saran et al. |
| 6,057,231 A | | 5/2000 | Givens et al. |

OTHER PUBLICATIONS

Dixit et al., "A Novel High Pressure Low Temperature Aluminum Plug Technology For Sub–0.5 μm Contact/Via Geometries", *IEDM*, pp. 105–108, 1994.

Dixit et al., "A Novel 0.25 μm Via Plug Process Using Low Temperature CVD Al.TiN", *IEDM95*, pp. 1001–1003.

Dixit et al., "A reactively sputtered coherent TiN process for sub–0.5 μm technology", *SPIE*, pp. 12–21, 1993.

Dixit et al., "An Integrated Low Resistance Aluminum Plug and Low–k Polymer Dielectric For High Performance 0.25 μm Interconnects", *1996 Symposium on VLSI Technology Digest of Technical Papers*, pp. 86–87, 1996.

Dixit et al., "Application of High Pressure Extruded Aluminum to ULSI Metallization", *Semiconductor International*, pp. 79–85, Aug. 1995.

Jain et al., "Chemical mechanical planarization of multilayer dielectric stacks", *SPIE*, vol. 2335, pp. 2–11.

Mizobuchi et al., "Application of Force Fill Al–Plug Technology to 64Mb DRAM and 0.35 μm Logic", *1995 Symposium on VLSI Technology Digest of Technical Papers*, 45–46.

Ting et al., "Effect of Via Etch Profile and Barrier Metal on Electromigration Performance of W–filled Via Structure in TiN/AlCu/TiN Metallization", *Mat. Res. Soc. Symp. Proc.*, vol. 391, pp. 453–458, 1995.

* cited by examiner

*Primary Examiner*—T. N. Quach
(74) *Attorney, Agent, or Firm*—TraskBritt

(57) ABSTRACT

An improved semiconductor device structure comprises insertion of a semiconductor wafer into a high-pressure heated chamber and the deposition of a low-melting-point aluminum material into a contact hole or via and over an insulating layer overlying a substrate of the wafer. The wafer is heated up to the melting point of the aluminum material and the chamber is pressurized to force the aluminum material into the contact holes or vias and eliminate voids present therein. A second layer of material, comprising a different metal or alloy, which is used as a dopant source, is deposited over an outer surface of the deposited aluminum material layer and allowed to diffuse into the aluminum material layer in order to form a homogenous aluminum alloy within the contact hole or via. A semiconductor device structure made according to the method is also disclosed.

46 Claims, 4 Drawing Sheets

CONTACT/VIA FORCE FILL TECHNIQUES AND RESULTING STRUCTURES

Cross Reference to Related Application

This application is a divisional of application Ser. No. 09/146,719, filed Sep. 3, 1998, now U.S. Pat. No. 6,124,205, issued Sep. 26, 2000.

BACKGROUND OF THE INVENTION

1. Field of the Invention

The present invention relates to semiconductor devices and, more particularly, to a low temperature method of filling contact holes or vias with a low melting-point aluminum material and subsequently depositing a second layer dopant for diffusion into the aluminum-filled contact hole or via to form an alloy therein.

2. State of the Art

As semiconductor device dimensions shrink, both gap-fill and planarity of the dielectric films become increasingly important. These challenging gap-fill requirements have initiated and stimulated a search for new processes and materials. Many of these devices, such as advanced ultra-large scale integrated (ULSI) devices, utilize elaborate, multi-level metallization schemes to enhance performance and achieve functional integration. As these device dimensions shrink, intra-lead capacitance becomes a major limiting factor in determining the total interconnect capacitance. Use of multi-level metal structures incorporating low dielectric constant materials is therefore necessary to limit the impact of capacitance on power, cross-talk, and RC delay of dense, deep sub-half micron interconnects.

Due to the ease of its integration therein, aluminum materials are a preferred material for contact/via resistances, fewer overall process steps, and improved electromigration performance. While aluminum reflow has been used for filling contacts and vias having widths equal to or smaller than 0.5 μm, aluminum reflow processes have not been widely accepted due to the higher deposition temperatures required in comparison to filling processes employing metals or alloys having lower melting-point temperatures than aluminum materials. Additionally, aluminum reflow processes are usually ineffective in completely filling contacts and vias having high aspect ratios, that is, contacts and vias having a high ratio of length or depth of a hole or via in relation to the preplated diameter of the contact or via.

Various methods of spreading aluminum or other conductive film on the principal surface to fill the contact holes are already in practical use. These methods include a high temperature sputter method, a bias sputter method, and a reflow after sputter method. A major disadvantage of these conventional aluminum reflow processes is the sensitivity of reflow to surface conditions, the hole profile and the type of substrate material. For example, conventional hot sputter deposition and/or reflow processes rely on the diffusive mobility of the atoms. Reflow characteristics are adversely affected by higher contact/via aspect ratios and the typical protrusion of sputtered barrier layers at the hole entrance, making consistent global filling difficult to achieve. Other detriments to complete filling include the presence of spin-on dielectrics and the associated out-gassing from the vias during the reflow process. Global filling is of particular concern for sub-half micron applications since a feasible aluminum reflow technology must be capable of achieving at least an equivalent yield and reliability as compared to conventional technologies, such as a tungsten plug process.

To alleviate some of these problems, a high pressure (>700 atm) forced fill Al-plug process has been used for sub-half micron contact and via hole filling. This process typically consists of a bake, soft sputter etch, barrier deposition and aluminum plug formation. The aluminum hole filling is achieved via a two-step process. As shown in FIGS. 1 and 2 (representing a section or segment of a semiconductor wafer 30), aluminum is applied to insulating layer 24 (typically comprising a dielectric such as SiO, boron nitride, and silicon nitride) overlying a substrate 20 through a conventional sputter deposition technique at about 400° C. Prior to the deposition of aluminum, holes or vias 25 are created (e.g. by etching) in insulating layer 24. The deposited aluminum fills or bridges the mouth of each hole 25 with metal alloy layer 22. However, due to the high aspect ratio of the formed hole and the inherent surface tension of metal alloy layer 22, void 26 usually forms inside each hole below-the filled or bridged mouth. The wafer is then transferred under vacuum to a so-called FORCE FILL™ Module, shown schematically in FIG. 7, consisting of a high-pressure chamber 80 with two radiant heaters 82 for controlling the temperature of wafer 84. Outlet port 88 is connected to a vacuum and controls pressurization of, and removal of gases from chamber 80, a wafer-receiving area. Inlet port 86 is connected to a pressurized source of gas, such as argon, for pressure regulation within chamber 80 and introduction of a precursor for plasma formation. The deposited aluminum is then forced into the holes by pressurizing the chamber, usually to about 760 atm, with argon while maintaining the temperature at about 400° C. As a result of the forced external pressure (represented by arrows 27 in FIG. 2) the aluminum bridge over hole or via 25 is deformed or extruded inwardly to accomplish complete hole filling, as shown in FIG. 2.

For purposes of the forced fill process, use of a low melting-point aluminum alloy (e.g. alloys of aluminum containing between about 10% and about 60% copper), which flows at reduced temperatures, is preferred over pure aluminum or high melting-point aluminum alloys, such as alloys containing 98% aluminum and 2% copper. As a consequence, because lower temperatures can be used for effective hole filling, the respective wafer or substrate containing the hole undergoes less thermal stress, which decreases the potential for damage to the structures, and ultimately the complete devices, being formed on and in the semiconductor material. On the other hand, high melting-point aluminum alloys, such as the Al—Cu alloy referenced above, possess superior electromagnetic and stress migration properties in comparison to low melting-point aluminum alloys and would thus be favored for use in contact/via fill processes if the disadvantages thereof could be reduced or eliminated.

Thus, it would be advantageous to provide an aluminum plug fill process which could be carried out at reduced temperatures and which also affords the superior electromagnetic and stress migration properties inherent in high melting-point aluminum alloys.

SUMMARY OF THE INVENTION

The present invention is directed to an improved method for filling contact holes or vias of semiconductor devices and the resulting structures. The improved method begins with insertion of the semiconductor wafer or other substrate of semiconductive material, having one or more contact holes or vias formed in an insulating layer overlying a wafer substrate, into a high-pressure heated chamber. A low melting-point base layer of aluminum material is then deposited over the insulating layer and into the contact holes or vias. During the deposition step, the wafer is heated up to the melting point of the aluminum material to reflow the same into the contact hole or via. Once deposition is completed and while maintaining the temperature elevated, the chamber is pressurized to force the aluminum material into the contact holes or vias and thus eliminate voids present therein under the aluminum material base layer. A second layer of material, comprising a metal or alloy to be used as a dopant source, is then deposited over a top surface of the deposited aluminum material base layer and allowed to diffuse into the aluminum material base layer in order to form a substantially homogenous aluminum alloy within the contact hole or via. The newly formed homogenous aluminum alloy possesses the desirable characteristics of the previously-mentioned high melting-point aluminum alloys, but without the associated difficulties and disadvantages of depositing such alloys in their preformed state. Formation of the homogenous aluminum alloy within the contact holes or vias of the wafer thus improves the strength, stress migration, and electromagnetic properties of the contacts or vias in a viable, economical manner easily applied to existing fabrication methodologies.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings, in which:

DETAILED DESCRIPTION OF THE INVENTION

Figure 1:
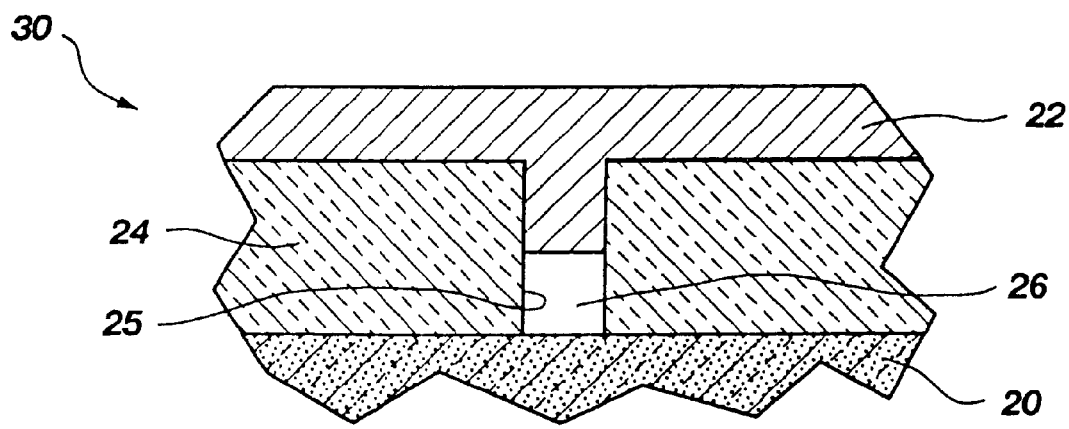
FIG. 1 is a cross-sectional view of a portion of an integrated circuit structure created through conventional sputter deposition of an aluminum alloy over a via or contact.
Figure 2:
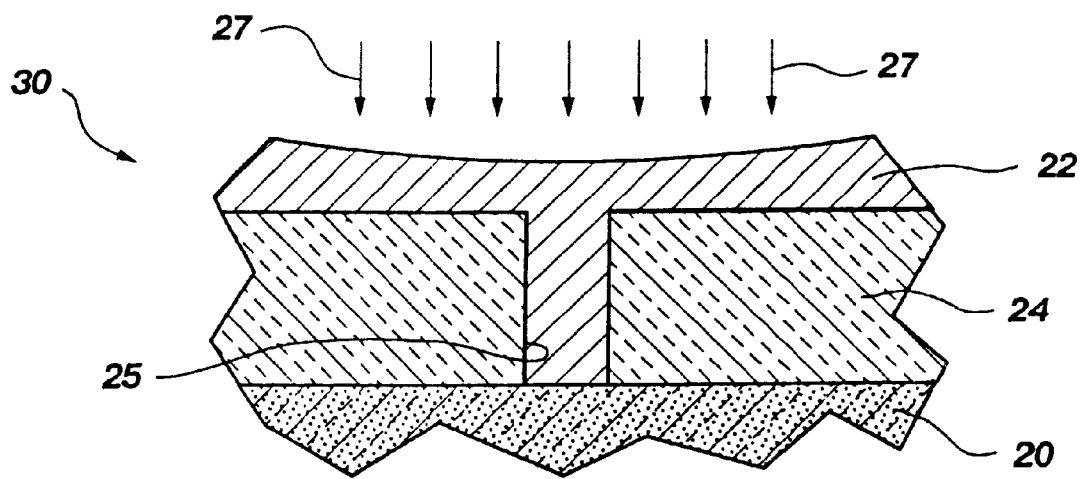
FIG. 2 is a cross-sectional view of the integrated circuit structure of FIG. 1 illustrating a high pressure forced fill process applied subsequent to the deposition step of FIG. 1.
Figure 3:
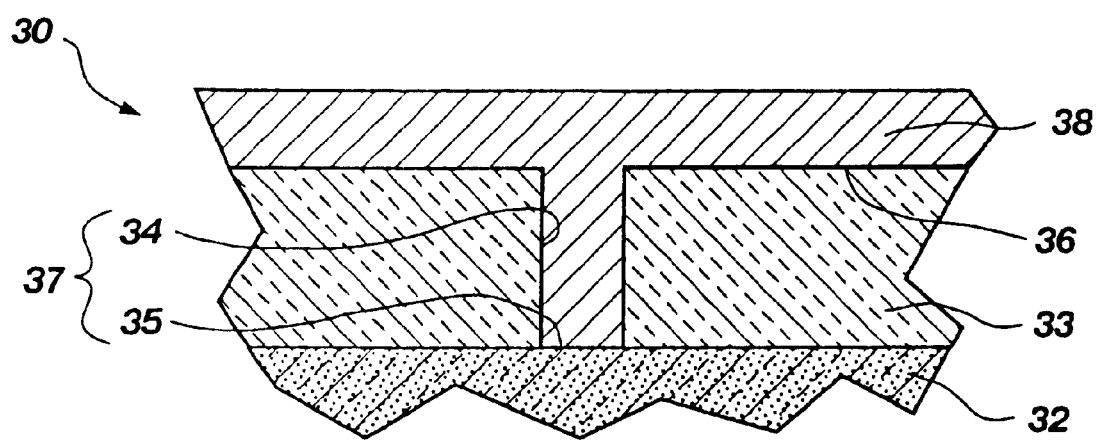
FIG. 3 is a cross-sectional view of a portion of an integrated circuit made in accordance with the present invention after high pressure forced fill of a contact hole or via with the aluminum material base layer.

Referring to FIG. 3, a cross-sectional view of a portion of a wafer or integrated circuit segment 30 is depicted. For purposes of this application, the term "wafer" or "integrated circuit" includes not only traditional wafers, but other substrates of semiconductor materials formed in different manners and specifically contemplated silicon-on-insulator (SOI) structures, silicon-on-ceramic structures, and layers of other semiconductive materials such as gallium arsenide and indium phosphide. For purposes of simplicity, elements common to FIGS. 1 and 2 will hereinafter be numbered identically in subsequent figures. The wafer 30 includes a semiconductive substrate layer 32 and an interlayer isolation or insulation layer 33. A contact hole or via 37 is defined by sidewall 34, extending from a principal or top surface 36 of insulation layer 33, to a bottom wall 35 that is defined by an exposed surface portion of the substrate layer 32. Contact hole 37 is representative of a plurality of contact holes or vias formed in wafer 30 and associated with the same or other circuit structures.

The hole filling process of the invention is suitable for, although not limited to, sub-half micron contact and via hole filling. The method can be applied in the fabrication of a variety of semiconductor devices and ULSI circuits, such as dynamic random access memories (DRAMs), static random access memories (SRAMs), flash memory processors, and application-specific integrated circuits (ASICs). While the diameter of contact hole 37 in most of these devices is typically less than or equal to 50 μm, it can be extended to any diameter in which substantially complete yield of contact filling is achievable. Where multiple-level metal formation is desired, such as in DRAM generation, contacts and vias with varying diameters can be patterned after interlevel dielectric deposition and planarization.

Generally, the hole filling process is initiated by performing the forced fill process, previously described in conjunction with FIG. 2, with a low melting-point aluminum alloy base layer 38 being deposited on top surface 36 of insulation layer 33, as shown in FIG. 3. Low melting-point aluminum alloys suitable for use in the hole-filling step of the present invention include any aluminum alloy having a lower melting point than those alloys, such as an aluminum alloy containing 98% aluminum and 2% copper which has a melting point of about 650° C., which are typically used in hole filling processes. Alternatively, low melting-point aluminum alloy base layer 38 can be selectively deposited over the contact hole 37 areas and not over top surface 36 of insulation layer 33. This selective deposition step can be facilitated through the use of a masking step or any other method known in the art for selective deposition of materials.

The aluminum layer used to fill the top of each hole 37 may be deposited through conventional sputter deposition techniques (also known as physical vapor deposition PVD)). In this preferred method, a solid slab of a low melting-point aluminum alloy is electrically grounded within a vacuum chamber to form a "target". A gas, typically argon, is introduced into the chamber and is ionized to a positive charge, thus forming a plasma. The positively charged argon atoms are attracted to the grounded target and accelerate toward the target, eventually striking the target and causing the aluminum atoms to scatter into the vacuum chamber. The sputtered aluminum atoms or molecules scatter in the chamber, with some coming to rest on wafer 30. Once the initial aluminum alloy layer is deposited, plasma continues to contact and heat aluminum alloy layer 38, thus facilitating reflow of aluminum alloy layer 38 into the holes 37. Advantageously, heat produced in the aluminum alloy layer 38 due to argon ion plasma irradiation dissipates through the wafer 30 towards a wafer support structure (not shown) of the PVD chamber. The dissipation of heat keeps wafer 30 at a sufficiently low temperature capable of preventing an adverse chemical reaction or thermal stress from taking place between aluminum alloy layer 38 and both insulation layer 33 and substrate layer 32 of wafer 30.

Figure 7:
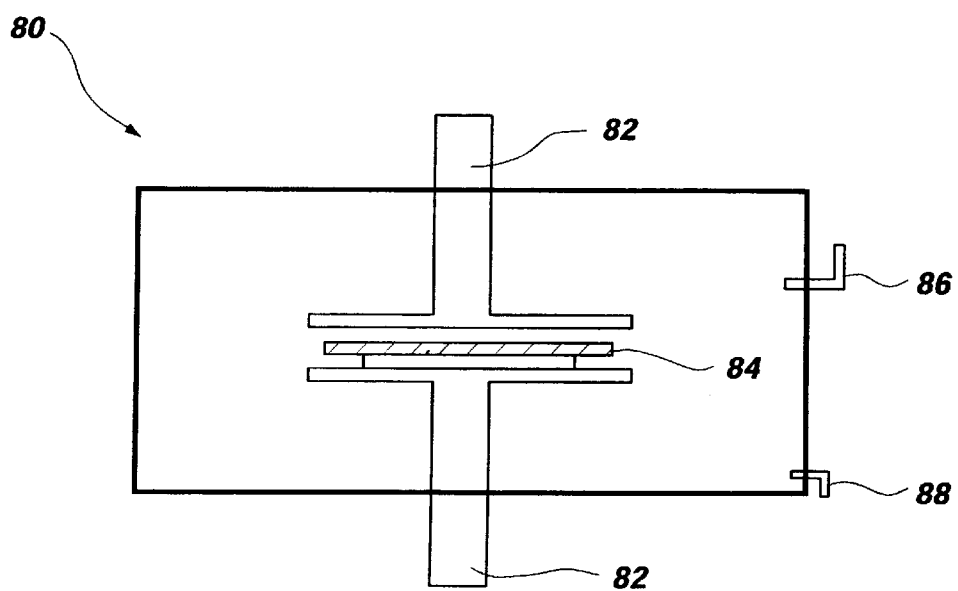
FIG. 7 is a schematic representation of a FORCE FILL™ Module used to carry out the present invention.

The sputter deposition technique is preferably conducted at a temperature of about 400° C. A heater 82 (FIG. 7), contained within the high-pressure chamber 80 (FIG. 7), can be used to subsequently heat aluminum alloy layer 38 to a sufficiently high temperature to cause the aluminum alloy layer 38 to reflow into contact hole 37. Alternatively, it is possible to heat the aluminum alloy layer 38 for reflow simultaneously while irradiation with the plasma is performed, especially when a reduction in the argon ion and plasma energy is desired.

A principal feature of the sputtering process is that the "target" material is deposited on the substrate layer insulation 32 over layer insulation layer 33 without chemical or compositional change, such as seen in the process of chemical vapor deposition (CVD). Deposition of aluminum through sputtering, as opposed to a CVD process, eliminates the need for deposition of TiN, which is required to ensure consistent nucleation of CVD-deposited aluminum prior to such deposition. Another advantage of sputtering over CVD is the conservation of target material composition.

Adhesion of the sputtered film to the top surface 36 of the insulation layer 33 is also improved in comparison to evaporation processes (such as electron-beam evaporation and inductive heating evaporation). The higher energy of the arriving aluminum atoms provides better adhesion, and the plasma environment (i.e., the ionized argon gas) inside the chamber has a "scrubbing" action on principal surface 36 and within the contact hole 37 surface that cleans these surfaces and thus enhances adhesion.

Various sputtering methods can be used in the method of the invention, such as diode sputtering using direct current, diode sputtering using radio frequency, triode sputtering, or magnetron sputtering. Sputter deposition of aluminum according to such processes bridges the top of each contact hole 37 and at least a portion of top surface 36 of the insulation layer 33 with aluminum, usually leaving an underlying void 26 inside hole 37, as previously described and shown in FIG. 1. High aspect ratio contacts and vias (i.e., contacts and vias having a high ratio of length or depth of a hole or via in relation to the preplated diameter of the contact or via) are particularly prone to incomplete filling of the hole 37.

According to the principles of the present invention, it is possible to thoroughly fill contact hole 37 with a low melting-point aluminum alloy layer 38, even where contact hole 37 has a high aspect ratio, while maintaining semiconductor substrate 32 at an appreciably low-temperature, such as 400° C. This low temperature process advantageously prevents impurities, usually emanating from insulation layer 33, from being taken into aluminum alloy layer 38, giving aluminum alloy layer 38 a substantially flat or planar surface which facilitates its working into and alignment with the wirings and surrounding structures. Furthermore, the low-temperature process decreases the attendant thermal stress typically seen between substrate layer 32, insulating layer 33, and aluminum alloy layer 38 when using high-temperature reflow processes.

Removal of the void inside contact hole 37 (already removed in FIG. 3) is accomplished through a forced fill process, as described above. However, because low melting-point aluminum alloys are used in place of the aluminum alloys traditionally used in the forced fill process (e.g. aluminum alloy containing 98% Al and 2% Cu, pure Al, or metal and alloys having a melting point greater than pure Al), operating pressures and temperatures may be reduced below conventional levels while still achieving complete hole filling. Alternatively, due to the lower melting point of the selected aluminum alloys, complete hole filling can be accomplished more rapidly when applying conventional operating pressures and temperatures.

Figure 4:
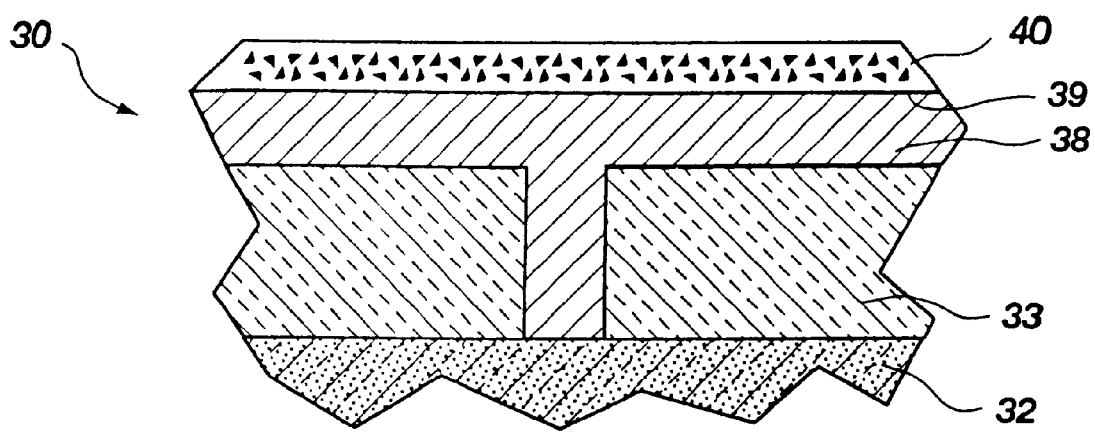
FIG. 4 is a cross-sectional view of the integrated circuit structure of FIG. 3 after deposition of a diffusion layer over the aluminum material base layer.

As shown in FIG. 4, following the deposition and forced fill steps, a second diffusion layer 40 of metal or alloy is deposited onto an exposed or outer surface 39 of the aluminum alloy layer 38. Suitable alloys for use as second diffusion layer 40 include alloys of aluminum containing from about 10% to about 60% copper, from about 10% to about 70% silver, greater than about 20% zinc, and greater than about 30% tin. In one preferred embodiment, substantially pure copper is used as the diffusion or dopant source and forms the second diffusion layer 40. Alternatively, an Al—Cu alloy can be used as a copper diffusion source. Suitable elements for use as a diffusion or dopant source include any metal or alloy which can be made to diff-use into the underlying aluminum alloy layer 38 and form a homogeneous aluminum alloy having desired electromagnetic and stress migration properties applicable for ULSI devices. Preferred alloys for use as second diffusion layer 40 include alloys of aluminum containing copper, silver, zinc, and tin. Preferred metals for use as second diffusion layer 40 include copper, silver, zinc, tin, and magnesium.

Where aluminum alloy base layer 38 is selectively deposited over the contact hole 37 areas and not over top surface 36 of insulation layer 33, as previously described in the alternative embodiment, second diffusion layer 40 of metal or alloy is selectively deposited onto exposed or outer surface 39 of the aluminum alloy layer 38. This selective deposition step can be facilitated through the use of a masking step or any other method known in the art for selective deposition of materials.

The metals and alloys forming second diffusion layer 40 can be deposited through any suitable deposition technique. One preferred deposition technique involves the deposition of copper by an electroless process. Traditional electroless copper plating processes, wherein an alkaline chelated copper reducing solution deposits a thin copper layer (usually 20 to 100 $\mu$m) on surfaces, can be employed in the instant process. Generally, the electroless plating process is initiated by combining a source of copper, such as copper sulfate ($CuSO_4$), with a reducing agent (preferably formaldehyde) to reduce the elemental copper (i.e., $Cu^{+2}=2e->Cu^0$). Sodium hydroxide is simultaneously combined to maintain the pH between about 11.5 and 12.5 in order to optimize aldehyde reduction. Complexers, such as EDTA and tartrates, hold the copper cations in solution at a high pH. In such a manner, metals such as copper and nickel can be deposited on underlying aluminum alloy layer 38 to form second diffusion layer 40. Those skilled in the art will recognize and apply the process steps, specific operating conditions, and process controls required to carry out electroless plating of second diffusion layer 40 according to the principles of this invention.

Vacuum evaporation is another technique which can be used for the deposition of metals on aluminum alloy layer 38. Vacuum evaporation takes place inside an evacuated chamber, where a metal is heated to a liquid state so that the atoms or molecules evaporate into the surrounding atmosphere within the chamber. Any known and suitable evaporation method (e.g., filament, electron beam, and flash hot plate evaporation) can be used to evaporate the metals, which will eventually form second diffusion layer 40, in the vacuum system. Vacuum evaporation is preferably performed with pure metals, as alloys are difficult to deposit by this method due to the different evaporation rates at specific temperatures for each element comprising the alloy, which would lead to deposition of second diffusion layer 40 having a different composition than the source alloy material.

Another preferred deposition technique involves PVD or sputter deposition, as described above with respect to the deposition of aluminum alloy layer 38. In contrast to the sputter deposition of aluminum alloy layer 38, the target can comprise any suitable or desirable metal (except aluminum) or alloy which makes an effective diffusion or dopant source (e.g., Cu or AlCu). As previously discussed, various sputtering methods can be used, such as diode sputtering using direct current, diode sputtering using radio frequency, triode sputtering, or magnetron sputtering.

Sputter deposition is particularly well suited when depositing an alloy as second diffusion layer 40, since sputter deposition does not rely on evaporation of materials having different evaporation rates. For example, in sputtering, an aluminum and 2% copper target material yields a substantially unchanged aluminum and 2% copper alloy layer 40 over aluminum alloy layer 38.

Figure 5:
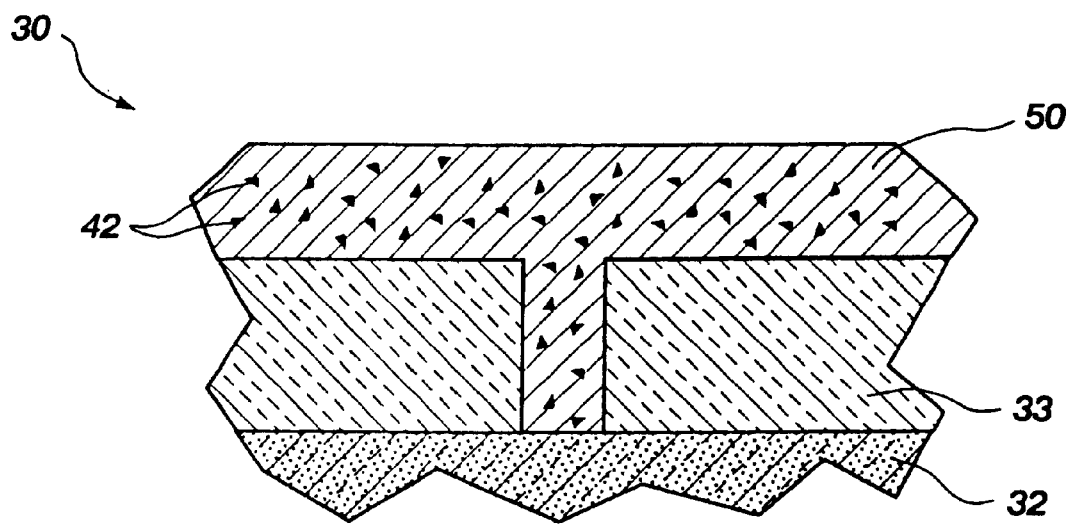
FIG. 5 is a cross-sectional view of the integrated circuit structure of FIG. 3 after the diffusion layer has diffused into the underlying aluminum layer to form an alloy of the two materials.

As shown in FIG. 5, once the second diffusion layer 40 is deposited onto the aluminum alloy layer 38, the second diffusion layer element(s) diffuse into and form a substantially homogeneous aluminum alloy layer 50. The second diffusion layer element(s) 42, constituting the material of the dopant source, is uniformly distributed throughout the aluminum alloy layer 38 by subjecting wafer 30 to elevated temperatures (preferably 400–500° C.), thus forming new alloy layer 50 over insulation layer 33 and within the contact hole 37. An annealing step can be added to improve dopant distribution and further diff-use the second diffusion layer element(s) 42 into the aluminum alloy layer 38.

Figure 6:
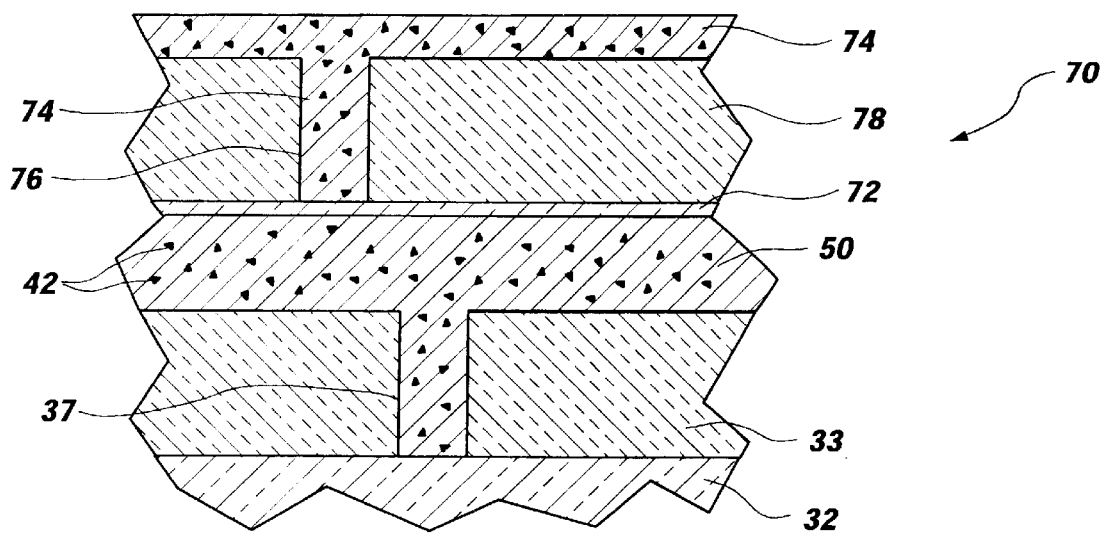
FIG. 6 is a cross-sectional view of a portion of a multi-level wiring structure made in accordance with the principles of the present invention.

In another preferred embodiment of the present invention, second insulation layer 78 can be deposited on homogeneous aluminum alloy layer 50 to create a multi-level wiring structure 70, as shown in FIG. 6. A third insulation layer 72 can be deposited between the second insulation layer 78 and the homogeneous aluminum alloy layer 50 to provide insulation between wiring structures being formed. Once second insulation layer 78 is deposited, the aforementioned steps (previously described in conjunction with FIGS. 3 through 5) are repeated to form a structure comprising second homogeneous aluminum alloy layer 74 which fills second hole 76 formed within second insulation layer 78. In carrying out reflow of second homogeneous aluminum alloy layer 74 into second holes 76 formed in the second insulation layer 78, attention should be directed to avoidance of any disturbance, such as reflow of previously-formed homogeneous aluminum alloy layer 50, of underlying hole 37. Due to the relatively higher melting point of homogeneous aluminum alloy layer 50 as compared to the low melting-point aluminum material initially being deposited within second hole 76, use of irradiation, either solely or in combination with heating of the second insulating layer by the heater to a temperature slightly above the melting point of the low melting-point aluminum material, is effective in preventing such reflow of existing hole fill materials.

While the hole fill method of the present invention has been described in terms of various preferred embodiments, it is understood that other methods could be adopted by one skilled in the art. For example, various deposition techniques, such as ion deposition, could be employed to deposit the aluminum alloy or second (dopant) layers. Where plasma-dependent deposition is employed, various inert gases could be used for generation of ion plasmas. Where alloys are deposited through PVD techniques, a single target consisting of an alloy can be used or individual targets, each containing individual metals which comprise the alloy, can be used to deposit the selected alloy in the desired constituent ratios. Accordingly, it is understood that the scope of the invention is not to be limited except as otherwise set forth in the claims.

What is claimed is:

1. A method of filling a contact hole extending through a dielectric layer overlying a semiconductor substrate, comprising:
    filling the contact hole with a metal material including aluminum as a major constituent;
    applying pressure and heat to said metal material to completely fill the contact hole; and
    modifying characteristics of said metal material by diffusing at least one second metal material into said metal material to form a non-deformed, substantially homogeneous aluminum alloy fill material in the contact hole.

2. The hole fill method of claim 1, wherein filling the contact hole with the metal material comprises filling the contact hole with an alloy containing aluminum and copper.

3. The hole fill method of claim 1, wherein diffusing the at least one second metal material comprises diffusing at least a second metal material selected from the group consisting of copper, silver, zinc, tin, nickel, and magnesium.

4. The hole fill method of claim 1, wherein filling the contact hole comprises physical vapor deposition of the metal material.

5. The hole fill method of claim 1, further comprising depositing the at least one second metal material onto the metal material through physical vapor deposition.

6. The hole fill method of claim 1, further comprising depositing the at least one second metal material onto the metal material through vacuum evaporation deposition.

7. The hole fill method of claim 6, wherein depositing the at least one second metal material comprises depositing at least one second metal material selected from the group consisting of copper, silver, zinc, tin, nickel, and magnesium.

8. The hole fill method of claim 1, wherein diffusing the at least one second metal material comprises depositing the at least one second metal material onto the metal material filling the contact hole, and heating the metal material filling the contact hole and the at least one second metal material.

9. The hole fill method of claim 8, wherein heating the metal material filling the contact hole comprises irradiating the metal material with argon plasma.

10. The hole fill method of claim 8, wherein heating the metal material filling the contact hole comprises simultaneously heating the metal material with a heater and irradiating the metal material with argon plasma.

11. The hole fill method of claim 1, wherein diffusing the at least one second metal material comprises depositing the at least one second metal material onto the metal material filling the contact hole and heating and applying pressure to the metal material filling the contact hole and the at least one second metal material.

12. The hole fill method of claim 11, wherein heating the metal material filling the contact hole comprises irradiating the metal material with argon plasma.

13. The hole fill method of claim 11, wherein heating the metal material filling the contact hole comprises simultaneously heating the metal material with a heater and irradiating the metal material with argon plasma.

14. The hole fill method of claim 11, wherein applying pressure comprises introducing the semiconductor substrate into a high-pressure chamber and pressurizing the high-pressure chamber.

15. The hole fill method of claim 14, further comprising maintaining a temperature within the high-pressure chamber at about 400° C.

16. The hole fill method of claim 14, wherein the high-pressure chamber is pressurized to more than 500 atm.

17. The hole fill method of claim 8, wherein depositing the at least one second metal material comprises physical vapor deposition of the metal material.

18. The hole fill method of claim 8, wherein depositing at least one second metal material comprises vacuum evaporation deposition of a different metal material.

19. The hole fill method of claim 18, wherein depositing the at least one second metal material comprises depositing a metal alloy.

20. The hole fill method of claim 8, wherein depositing at least one second metal material comprises depositing a substantially pure metal.

21. The hole fill method of claim 20, wherein depositing the at least one second metal material comprises depositing copper.

22. The hole fill method of claim 21, wherein the copper is deposited on the metal material through an electroless plating process.

23. The hole fill method of claim 20, wherein depositing the at least one second metal material comprises depositing nickel.

24. The hole fill method of claim 23, wherein the nickel is deposited on the metal material through an electroless plating process.

25. A method of filling a contact hole extending through a dielectric layer overlying a semiconductor substrate, comprising:

filling the contact hole with a metal material including aluminum as a major constituent;

depositing at least one second metal material onto the metal material filling the contact hole;

applying pressure and heat to said metal material to completely fill the contact hole; and modifying characteristics of the metal material by diffusing the at least one second metal material into said metal material to form a non-deformed, substantially homogeneous aluminum alloy fill material in the contact hole.

26. The hole fill method of claim 25, wherein filling the contact hole with the metal material comprises filling the contact hole with an alloy containing aluminum and at least one metal selected from the group consisting of copper, silver, zinc, nickel, and tin.

27. The hole fill method of claim 25, wherein diffusing the at least one second metal material comprises diffusing at least one second metal material selected from the group consisting of copper, silver, zinc, tin, nickel, and magnesium.

28. The hole fill method of claim 25, wherein filling the contact hole comprises physical vapor deposition of the metal material.

29. The hole fill method of claim 25, wherein filling the contact hole comprises vacuum evaporation deposition of the metal material.

30. The hole fill method of claim 25, wherein diffusing the at least one second metal material comprises heating the metal material filling the contact hole and the at least one second metal material.

31. The hole fill method of claim 30, wherein heating the metal material filling the contact hole comprises irradiating the metal material with argon plasma.

32. The hole fill method of claim 30, wherein heating the metal material filling the contact hole comprises simultaneously heating the metal material with a heater and irradiating the metal material with argon plasma.

33. The hole fill method of claim 25, wherein diffusing the at least one second metal material comprises heating and applying pressure to the metal material filling the contact hole and the at least one second metal material.

34. The hole fill method of claim 33, wherein heating the metal material filling the contact hole comprises irradiating the metal material with argon plasma.

35. The hole fill method of claim 33, wherein heating the metal material filling the contact hole comprises simultaneously heating the metal material with a heater and irradiating the metal material with argon plasma.

36. The hole fill method of claim 33, wherein applying pressure comprises introducing the semiconductor substrate into a high-pressure chamber and pressurizing the high-pressure chamber.

37. The hole fill method of claim 36, further comprising maintaining a temperature within the high-pressure chamber at about 400° C.

38. The hole fill method of claim 36, wherein the high-pressure chamber is pressurized to more than 500 atm.

39. The hole fill method of claim 30, wherein depositing the at least one second metal material comprises physical vapor deposition of the metal material.

40. The hole fill method of claim 25, wherein depositing the at least one second metal material comprises vacuum evaporation deposition of a different metal material.

41. The hole fill method of claim 40, wherein depositing the at least one second metal material comprises depositing a metal alloy.

42. The hole fill method of claim 25, wherein depositing the at least one second metal material comprises depositing a substantially pure metal.

43. The hole fill method of claim 42, wherein depositing the at least one second metal material comprises depositing copper.

44. The hole fill method of claim 43, wherein the copper is deposited on the mental material through an electroless plating process.

45. The hole fill method of claim 43, wherein depositing the at least one second metal material comprises depositing nickel.

46. The hole fill method of claim 45, wherein the nickel is deposited on the mental material through an electroless plating process.

* * * * *

UNITED STATES PATENT AND TRADEMARK OFFICE
CERTIFICATE OF CORRECTION

PATENT NO. : 6,391,778 B1  
APPLICATION NO. : 09/505607  
DATED : May 21, 2002  
INVENTOR(S) : Trung T. Doan Page 1 of 1

It is certified that error appears in the above-identified patent and that said Letters Patent is hereby corrected as shown below:

On the title page:
In ITEM (57) "Abstract,"

| | | | |
|---|---|---|---|
| | COLUMN 2, | LINE 3, | change "low-melting-point" to --low melting-point-- |
| | COLUMN 2, | LINE 18, | change "below-the" to --below the-- |
| | COLUMN 3, | LINE 42, | after "circuit" and before "made" insert --structure-- |
| | COLUMN 4, | LINE 46, | change "PVD))." to --(PVD)).-- |
| | COLUMN 5, | LINE 55, | change "insulting" to --insulation-- |
| | COLUMN 5, | LINE 65, | change "melting point" to --melting-point-- |
| | COLUMN 6, | LINE 17, | change "diff-use" to --diffuse-- |
| | COLUMN 6, | LINE 44, | change "Cu$^o$" to --Cu$^0$-- |
| | COLUMN 7, | LINE 31, | change "diff-use" to --diffuse-- |
| | COLUMN 7, | LINE 49, | change "previously-formed" to --previously formed-- |
| CLAIM 44, | COLUMN 10, | LINE 50, | change "mental" to --metal-- |
| CLAIM 46, | COLUMN 10, | LINE 56, | change "mental" to --metal-- |

Signed and Sealed this

Sixth Day of November, 2007

JON W. DUDAS  
*Director of the United States Patent and Trademark Office*